United States Patent
Koes et al.

(10) Patent No.: US 7,364,672 B2
(45) Date of Patent: Apr. 29, 2008

(54) LOW LOSS PREPREGS, COMPOSITIONS USEFUL FOR THE PREPARATION THEREOF AND USES THEREFOR

(75) Inventors: Thomas Allan Koes, Riverside, CA (US); Ousama Najjar, Rancho Cucamonga, CA (US)

(73) Assignee: Arlon, Inc., Rancho Cucamonga, CA (US)

( * ) Notice: Subject to any disclaimer, the term of this patent is extended or adjusted under 35 U.S.C. 154(b) by 142 days.

(21) Appl. No.: 11/006,211

(22) Filed: Dec. 6, 2004

(65) Prior Publication Data

US 2006/0118766 A1    Jun. 8, 2006

(51) Int. Cl.
   *H01B 1/12*   (2006.01)
   *C08L 23/08*  (2006.01)
(52) U.S. Cl. .................. 252/500; 525/240; 525/241; 525/238
(58) Field of Classification Search ............... 525/240, 525/241, 238; 252/500
See application file for complete search history.

(56) References Cited

U.S. PATENT DOCUMENTS

| | | | |
|---|---|---|---|
| 3,653,423 A | 4/1972 | Paddock |
| 3,950,604 A | 4/1976 | Penneck |
| 3,968,316 A | 7/1976 | Jyo et al. |
| 4,024,318 A | 5/1977 | Forster et al. |
| 4,126,647 A | 11/1978 | Howard, Jr. |
| 4,166,170 A | 8/1979 | St. Clair |
| 4,228,265 A | 10/1980 | Ohishi et al. |
| 4,233,258 A | 11/1980 | St. Clair |
| 4,248,985 A | 2/1981 | Ohishi et al. |
| 4,252,692 A | 2/1981 | Taylor et al. |
| 4,281,102 A | 7/1981 | St. Clair et al. |
| RE31,322 E | 7/1983 | Ohishi et al. |
| 4,500,596 A | 2/1985 | Lee |
| 4,560,729 A | 12/1985 | Watanabe et al. |
| 4,613,633 A | 9/1986 | Sekiya et al. |
| 4,614,779 A | 9/1986 | Watanabe et al. |
| 4,642,324 A | 2/1987 | Kobayashi et al. |
| 4,822,654 A | 4/1989 | Takemura et al. |
| 4,894,281 A | 1/1990 | Yagi et al. |
| 4,910,077 A | 3/1990 | Benedikt |
| 4,918,144 A | 4/1990 | Fukuda |
| 4,923,734 A | 5/1990 | Benedikt |
| 4,956,417 A | 9/1990 | Hayashi et al. |
| 4,965,323 A | 10/1990 | Watanabe et al. |
| 4,968,753 A | 11/1990 | Oyama et al. |
| 4,980,269 A | 12/1990 | Sakurai et al. |
| 4,983,678 A | 1/1991 | Saito et al. |
| 4,988,548 A | 1/1991 | Takemura et al. |
| 4,990,570 A | 2/1991 | Saito et al. |
| 5,013,796 A | 5/1991 | Hayashi et al. |
| 5,013,797 A | 5/1991 | Hayashi et al. |
| 5,137,977 A | 8/1992 | Saitoh et al. |
| 5,157,083 A | 10/1992 | Aonuma et al. |
| 5,179,164 A | 1/1993 | Lausberg et al. |
| 5,187,012 A | 2/1993 | Takahashi et al. |
| 5,206,092 A | 4/1993 | Araki et al. |
| 5,244,955 A | 9/1993 | Toyoda |
| 5,247,018 A | 9/1993 | Maeda et al. |
| 5,281,510 A | 1/1994 | Sakurai et al. |
| 5,290,857 A | 3/1994 | Ashida et al. |
| 5,296,555 A | 3/1994 | Ozawa |
| 5,298,542 A | 3/1994 | Nakamura et al. |
| 5,302,463 A | 4/1994 | Murata et al. |
| RE34,638 E | 6/1994 | Benedikt |
| 5,366,812 A | 11/1994 | Takahashi et al. |
| 5,376,448 A | 12/1994 | Suzuki et al. |
| 5,378,543 A | 1/1995 | Murata et al. |
| 5,424,135 A | 6/1995 | Murata et al. |
| 5,432,226 A | 7/1995 | Aonuma et al. |
| 5,446,098 A | 8/1995 | Fukuda et al. |
| 5,556,919 A | 9/1996 | Oyama et al. |
| 5,571,609 A | 11/1996 | St. Lawrence et al. |
| 5,574,100 A | 11/1996 | Sagane et al. |
| 5,612,125 A | 3/1997 | Kobayashi et al. |
| 5,637,179 A | 6/1997 | Nakayama et al. |
| 5,651,995 A | 7/1997 | Oyama et al. |

(Continued)

FOREIGN PATENT DOCUMENTS

EP    0 353 766    2/1990

(Continued)

*Primary Examiner*—Robert D. Harlan
(74) *Attorney, Agent, or Firm*—Foley & Lardner LLP; Stephen E. Reiter

(57) ABSTRACT

In accordance with the present invention, we have developed compositions useful for the preparation of prepregs, laminates, and the like having excellent performance properties. Invention compositions comprise a combination of a first component (i.e., a low loss, low dielectric constant, hydrocarbyl thermoplastic resin), a second component (i.e., a component which is capable of crosslinking to produce a thermoset in the presence of the first component), a free radical source, and optionally, one or more additives and/or diluents. Invention compositions can be prepared from widely available and inexpensive starting materials. As a result, invention compositions not only provide fabricated articles having outstanding performance properties, in addition, the cost of producing the resulting articles compares quite favorably with the cost of making competitive materials which require the use of more expensive, less readily available starting materials. Also provided in accordance with the present invention are prepregs prepared from invention compositions, laminated sheets prepared from the above-described prepregs, printed wiring boards, methods of making each of the above, and the like.

50 Claims, No Drawings

U.S. PATENT DOCUMENTS

| | | | |
|---|---|---|---|
| 5,683,819 | A | 11/1997 | Mori et al. |
| 5,686,509 | A | 11/1997 | Nakayama et al. |
| 5,703,189 | A | 12/1997 | Tsuji et al. |
| 5,723,388 | A | 3/1998 | Kobayashi et al. |
| 5,770,655 | A | 6/1998 | Sagane et al. |
| 5,807,941 | A | 9/1998 | Tsuji et al. |
| 5,830,941 | A | 11/1998 | Aimura et al. |
| 5,852,093 | A | 12/1998 | Aimura et al. |
| 5,855,976 | A | 1/1999 | Oyama et al. |
| 5,856,395 | A | 1/1999 | Tanisho et al. |
| 5,902,860 | A | 5/1999 | Abusleme et al. |
| 5,972,272 | A | 10/1999 | Nagase et al. |
| 5,998,531 | A | 12/1999 | Aimura et al. |
| 6,020,440 | A | 2/2000 | Tabb |
| 6,057,395 | A | 5/2000 | Nishimura |
| 6,087,453 | A | 7/2000 | Nishimura |
| 6,121,383 | A | 9/2000 | Abdou-Sabet et al. |
| 6,146,739 | A | 11/2000 | Itoh et al. |
| 6,201,064 | B1 | 3/2001 | Aoyama et al. |
| 6,221,971 | B1 | 4/2001 | Tabb |
| 6,245,915 | B1 | 6/2001 | Wood et al. |
| 6,268,417 | B1 | 7/2001 | Ozawa et al. |
| 6,270,900 | B1 | 8/2001 | Wakizaka et al. |
| 6,281,293 | B1 | 8/2001 | Fujii |
| 6,281,297 | B1 | 8/2001 | Aoyama et al. |
| 6,303,666 | B1 | 10/2001 | Yorita et al. |
| 6,303,727 | B1 | 10/2001 | Maeda et al. |
| 6,310,164 | B1 | 10/2001 | Morizono et al. |
| 6,329,465 | B1 | 12/2001 | Takahashi et al. |
| 6,337,402 | B2 | 1/2002 | Wood et al. |
| 6,346,581 | B1 | 2/2002 | Tsunogae et al. |
| 6,376,584 | B1 | 4/2002 | Galbo et al. |
| 6,383,500 | B1 | 5/2002 | Wooley et al. |
| 6,388,015 | B1 | 5/2002 | Aimura et al. |
| 6,410,653 | B1 | 6/2002 | Fujii et al. |
| 6,472,082 | B2 | 10/2002 | Kodemura |
| 6,489,385 | B1 | 12/2002 | Fujii et al. |
| 6,491,903 | B1 | 12/2002 | Forster et al. |
| 6,492,443 | B1 * | 12/2002 | Kodemura et al. ......... 524/114 |
| 6,528,556 | B1 | 3/2003 | Herbst et al. |
| 6,534,594 | B1 | 3/2003 | Kimura et al. |
| 6,544,610 | B1 | 4/2003 | Minami et al. |
| 6,576,311 | B2 | 6/2003 | Noguchi et al. |
| 6,589,664 | B1 | 7/2003 | Kobayashi et al. |
| 6,677,392 | B2 | 1/2004 | Ravichandran et al. |
| 6,679,754 | B2 | 1/2004 | Li et al. |
| 6,683,134 | B2 | 1/2004 | Miyamoto et al. |
| 7,041,741 | B2 * | 5/2006 | Patel et al. ................. 525/191 |
| 2002/0041966 | A1 | 4/2002 | Lane et al. |
| 2004/0132925 | A1 | 7/2004 | Saitou et al. |

FOREIGN PATENT DOCUMENTS

| | | |
|---|---|---|
| EP | 0 498 383 A2 | 8/1992 |
| EP | 0 540 941 B1 | 5/1993 |
| EP | 0 578 255 A2 | 1/1994 |
| EP | 0 895 526 B1 | 2/1999 |
| EP | 0 906 373 B1 | 4/1999 |
| EP | 0 936 231 B1 | 8/1999 |
| EP | 1 103 042 B1 | 5/2001 |
| JP | 09702735 | 2/1998 |
| JP | 00105818 | 1/2002 |
| WO | WO 98/05715 | 2/1998 |

* cited by examiner

LOW LOSS PREPREGS, COMPOSITIONS USEFUL FOR THE PREPARATION THEREOF AND USES THEREFOR

FIELD OF THE INVENTION

The present invention relates to prepregs, laminates and compositions useful for the preparation thereof. Invention materials are useful, for example, in the preparation of components used in RF applications, applications where low electrical loss products are required, e.g., in cellular telecommunications, laminate-based chip carriers, and the like.

BACKGROUND OF THE INVENTION

Laminates and prepreg systems employed in cellular telecommunications, laminate-based chip carriers, and the like, must meet a number of physical and electrical performance criteria, e.g., low loss, low dielectric constant, good heat resistance, good dimensional stability, and the like. In view of the high demand and widespread use of such materials, in addition to meeting the above-described performance properties, it is further desirable that such materials are capable of being prepared from relatively inexpensive starting materials employing readily scalable, low cost processes. The present invention addresses these and other needs as described in greater detail herein.

SUMMARY OF THE INVENTION

In accordance with the present invention, we have developed compositions useful for the preparation of prepregs, laminates, and the like having excellent performance properties. Invention compositions comprise a combination of a first component (i.e., a low loss, low dielectric constant, hydrocarbyl thermoplastic resin), a second component (i.e., a component which is capable of crosslinking to produce a thermoset in the presence of the first component), a free radical source, and optionally, one or more additives and/or diluents.

Invention compositions can be prepared from widely available and inexpensive starting materials. As a result, invention compositions not only provide fabricated articles having outstanding performance properties, in addition, the cost of producing the resulting articles compares quite favorably with the cost of making competitive materials which require the use of more expensive, less readily available starting materials.

Also provided in accordance with the present invention are prepregs prepared from invention compositions, laminated sheets prepared from the above-described prepregs, printed wiring boards, methods of making each of the above, and the like.

DETAILED DESCRIPTION OF THE INVENTION

In accordance with the present invention, there are provided compositions comprising:
  (a) a first component comprising a low loss, low dielectric constant, hydrocarbyl thermoplastic resin,
  (b) a second component which is capable of crosslinking to produce a thermoset in the presence of the first component,
  (c) a free radical source,
  (d) optionally, one or more additives, and
  (e) an optional diluent therefor.

As employed herein, the term "low loss" refers to materials which cause minimal signal loss when associated with signal transmission.

As employed herein, the term "low dielectric constant" refers to materials which resist the passage of electric current therethrough.

As employed herein, the term "hydrocarbyl thermoplastic resins" refers to polymeric materials which are prepared from non-heteroatom containing, unsaturated hydrocarbons, e.g., polyolefins, co-polymers including olefin monomers, cyclic olefin monomers, and the like, terpolymers, block copolymers, and the like.

Low loss, low dielectric constant, hydrocarbyl thermoplastic resins contemplated for use in the practice of the present invention can be characterized, for example, as materials which, when laminated, have a dielectric constant ≦4.5 nominal, and an electrical loss tangent ≦0.02. Additionally, such materials contemplated for use in the practice of the present invention may further be characterized as having a glass transition temperature ≧80° C.

Optionally, low loss, low dielectric constant, hydrocarbyl thermoplastic materials contemplated for use in the practice of the present invention may be further characterized as being capable of undergoing further crosslinking. For example, such materials can be rendered capable of undergoing further crosslinking by the presence of residual unsaturation thereon. Alternatively, the low loss, low dielectric constant, hydrocarbyl thermoplastic resin can be rendered crosslinkable by the presence of one or more crosslinkable substituents thereon.

Exemplary low loss, low dielectric constant, hydrocarbyl thermoplastic resins contemplated for use in the practice of the present invention include cyclic olefin-containing copolymers, terpolymers, block copolymers, or combinations of any two or more thereof. Examples of cyclic olefin-containing copolymers include copolymers of an aliphatic olefin and a cyclic olefin, copolymers of an olefin and norbornene, and the like.

As readily recognized by those of skill in the art, the above-described copolymers can be synthesized in a variety of ways, e.g., by addition polymerization, by ring opening polymerization of norbornene with an olefin, and the like.

The molar ratio of olefin to norbornene can vary widely, typically falling in the range of about 1:6 up to about 1:1.5.

The molecular weight of cyclic olefin-containing copolymers contemplated for use in the practice of the present invention can vary widely, typically falling in the range of about 500 up to about 100,000, with a preferred molecular weight typically falling in the range of about 20,000 up to about 90,000, with a molecular weight in the range of about 70,000 up to about 90,000 being the presently most preferred.

Components contemplated for use in the practice of the present invention which are capable of crosslinking to produce a thermoset in the presence of the first component can be monomeric, oligomeric or polymeric.

Typically, such compounds are free-radically crosslinkable. In one aspect of the invention, such compounds are substantially non-polar.

Exemplary components contemplated for use in the practice of the present invention which are capable of crosslinking to produce a thermoset have the structure (II) as follows:

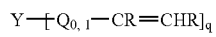
(II)

wherein:
q is an integer between 1 and 6, provided, however, that not all q's are 1,
each R is independently selected from hydrogen or lower alkyl,
each Q, when present, is independently selected from —CH$_2$—, —O—, —O—C(O)—, —C(O)— or —C(O)—O—, and
each Y is independently a monovalent or polyvalent moiety, provided, however, that not all Y's are monovalent.

Monovalent or polyvalent Y can be selected from among many possibilities, such as, for example, hydrocarbyl, substituted hydrocarbyl, heteroatom-containing hydrocarbyl, substituted heteroatom-containing hydrocarbyl, hydrocarbylene, substituted hydrocarbylene, heteroatom-containing hydrocarbylene, substituted heteroatom-containing hydrocarbylene, and technically feasible combinations of any of the above with a linker selected from the group consisting of a covalent bond, —O—, —S—, —NR—, —O—C(O)—, —O—C(O)—O—, —O—C(O)—NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, —NR—P(O)R$_2$—; wherein each R is independently hydrogen, alkyl or substituted alkyl, and the like.

As employed herein, "hydrocarbyl" embraces alkyl, substituted alkyl, alkoxy, substituted alkoxy, cycloalkyl, substituted cycloalkyl, alkenyl, substituted alkenyl, alkynyl, substituted alkynyl, monocyclic heterocylic, substituted monocyclic heterocyclic, monocyclic aromatic, monosubstituted monocyclic aromatic, or the like.

As employed herein, "alkyl" refers to hydrocarbyl radicals having 1 up to 20 carbon atoms, preferably 2-10 carbon atoms; and "substituted alkyl" comprises alkyl groups further bearing one or more substituents selected from hydroxy, alkoxy (of a lower alkyl group), mercapto (of a lower alkyl group), cycloalkyl, substituted cycloalkyl, heterocyclic, substituted heterocyclic, aryl, substituted aryl, heteroaryl, substituted heteroaryl, aryloxy, substituted aryloxy, halogen, trifluoromethyl, cyano, nitro, nitrone, amino, amido, C(O)H, acyl, oxyacyl, carboxyl, carbamate, sulfonyl, sulfonamide, sulfuryl, and the like.

As employed herein, "alkoxy" refers to the moiety —O-alkyl-, wherein alkyl is as defined above, and "substituted alkoxy" refers to alkoxy groups further bearing one or more substituents as set forth above.

As employed herein, "cycloalkyl" refers to cyclic ring-containing groups containing in the range of about 3 up to 8 carbon atoms, and "substituted cycloalkyl" refers to cycloalkyl groups further bearing one or more substituents as set forth above.

As employed herein, "heterocyclic" refers to cyclic (i.e., ring-containing) groups containing one or more heteroatoms (e.g., N, O, S, or the like) as part of the ring structure, and having in the range of 3 up to 14 carbon atoms and "substituted heterocyclic" refers to heterocyclic groups further bearing one or more substituents as set forth above.

As employed herein, "alkenyl" refers to straight or branched chain hydrocarbyl groups having at least one carbon-carbon double bond, and having in the range of about 2 up to 12 carbon atoms, and "substituted alkenyl" refers to alkenyl groups further bearing one or more substituents as set forth above.

As employed herein, "alkynyl" refers to straight or branched chain hydrocarbyl groups having at least one carbon-carbon triple bond, and having in the range of about 2 up to 12 carbon atoms, and "substituted alkynyl" refers to alkynylene groups further bearing one or more substituents as set forth above.

As employed herein, "monocyclic aromatic" refers to aromatic groups having in the range of 5 up to 7 carbon atoms and "monosubstituted monocyclic aromatic" refers to aromatic groups further bearing one of the substituents set forth above.

As employed herein, "alkylene" refers to divalent hydrocarbyl radicals having 1 up to 20 carbon atoms, preferably 2-10 carbon atoms; and "substituted alkylene" comprises alkylene groups further bearing one or more substituents as set forth above.

As employed herein, "cycloalkylene" refers to divalent cyclic ring-containing groups containing in the range of about 3 up to 8 carbon atoms, and "substituted cycloalkylene" refers to cycloalkylene groups further bearing one or more substituents as set forth above.

As employed herein, "cycloalkenylene" refers to divalent, ene-functionalized (e.g., vinyl or allyl groups) cycloaliphatic groups containing in the range of about 3 up to 8 carbon atoms, and "substituted cycloalkenylene" refers to cycloalkenylene groups further bearing one or more substituents as set forth above.

As employed herein, "oxyalkylene" refers to the divalent moiety —O-alkylene-, wherein alkylene is as defined above, and "substituted oxyalkylene" refers to oxyalkylene groups further bearing one or more substituents as set forth above.

As employed herein, "oxyalkenylene" refers to the divalent, ene-functionalized moiety —O-alkenylene-, wherein alkenylene is as defined herein, and "substituted oxyalkenylene" refers to oxyalkenylene groups further bearing one or more substituents as set forth above.

As employed herein, "alkenylene" refers to divalent, straight or branched chain hydrocarbyl groups having at least one carbon-carbon double bond, and having in the range of about 2 up to 12 carbon atoms, and "substituted alkenylene" refers to alkenylene groups further bearing one or more substituents as set forth above.

As employed herein, "alkynylene" refers to divalent linear or branched chain hydrocarbyl groups having at least one carbon-carbon triple bond, and having in the range of about 2 up to 12 carbon atoms, and "substituted alkynylene" refers to alkynylene groups further bearing one or more substituents as set forth above.

As employed herein, "arylene" refers to divalent aromatic groups having in the range of 6 up to 14 carbon atoms and "substituted arylene" refers to arylene groups further bearing one or more substituents as set forth above.

As employed herein, "alkylarylene" refers to alkyl-substituted arylene groups and "substituted alkylarylene" refers to alkylarylene groups further bearing one or more substituents as set forth above.

As employed herein, "arylalkylene" refers to aryl-substituted alkylene groups and "substituted arylalkylene" refers to arylalkylene groups further bearing one or more substituents as set forth above.

As employed herein, "arylalkenylene" refers to aryl-substituted alkenylene groups and "substituted arylalkenylene" refers to arylalkenylene groups further bearing one or more substituents as set forth above.

As employed herein, "arylalkynylene" refers to aryl-substituted alkynylene groups and "substituted arylalkynylene" refers to arylalkynylene groups further bearing one or more substituents as set forth above.

Presently preferred components contemplated for use in the practice of the present invention which are capable of crosslinking to produce a thermoset include thermally stable dielectric materials such as di-allylic compound(s), tri-allylic compound(s), di-vinylic compound(s), tri-vinylic compound(s), conjugated diene(s), non-conjugated diene(s), di(meth)acrylate compound(s), tri(meth)acrylate compound(s), and the like, as well as mixtures of any two or more thereof.

Especially preferred components capable of crosslinking to produce a thermoset contemplated for use in the practice of the present invention include triallyl isocyanurate, triallyl cyanurate, 1,2,4-trivinylcyclohexane, 1,9-decadiene, 1,7-octadiene, and the like, as well as mixtures of any two or more thereof.

As readily recognized by those of skill in the art, the weight ratio between component (a) and component (b) of invention compositions can vary widely. Typically, such ratio falls in the range of about 1:1 up to about 100:1. In preferred embodiments, the weight ratio between component (a) and component (b) of invention compositions falls in the range of about 1.5:1 up to about 99:1.

Free radical sources contemplated for use in the practice of the present invention (i.e., component (c)) can be either thermally or photochemically activated.

Free radical sources that are capable of being activated thermally include peroxides, azo compounds, redox initiators, azides, and the like, as well as mixtures of any two or more thereof.

Presently preferred peroxides are those having a decomposition temperature of at least about 50° C. Exemplary peroxides contemplated for use in the practice of the present invention include ketone peroxides (e.g., methyl ethyl ketone peroxide, cyclohexanone peroxide, and the like), peroxyketals (e.g., 1,1-bis(t-butyl peroxy)-3,3,5-trimethylcyclohexane, 2,2-bis(t-butyl peroxy)butane, and the like), hydroperoxides (e.g., t-butyl hydroperoxide, 2,5-dimethylhexane-2,5-dihydroperoxide, and the like), dialkyl peroxides (e.g., dicumyl peroxide, 2,5-dimethyl-2,5-di(t-butyl peroxy)hexyne-3, α,α'-bis(t-butyl peroxy-m-isopropyl)benzene, and the like), diacyl peroxides (e.g., octanoyl peroxide, isobutyryl peroxide, and the like), peroxyesters (e.g., peroxydicarbonate), and the like.

An exemplary azo compound contemplated for use in the practice of the present invention is α,α'-azobis(isobutyronitrile).

Exemplary redox initiators contemplated for use in the practice of the present invention include combinations of peroxides (e.g., $H_2O_2$) and a ferrous salt, and the like.

An exemplary azide contemplated for use in the practice of the present invention is acetyl azide.

Exemplary compounds contemplated for use in this aspect of the present invention include benzophenone, 9-phenyl acridine, ethyl Michler's ketone (EMK), zinc acetylacetonate, triphenyl phosphine oxide, and the like, as well as mixtures of any two or more thereof.

As readily recognized by those of skill in the art, the amount of free radical source incorporated into invention compositions can vary widely. Typically, the amount of component (c) employed in invention compositions will fall in the range of about 0.01-10 weight percent, based on the total weight of the composition.

Optional additives contemplated for use in the practice of the present invention include fire retardants, fillers, fluorescent dyes, flow modifiers, plasticizers, cure retardants, cure accelerators, strength enhancers, UV protectors (especially UV blocking dyes appropriate to enable Automatic-Optical Inspection (AOI) of Circuitry), pigments, and the like, as well as mixtures of any two or more thereof.

Fire retardants contemplated for use in the practice of the present invention include substantially halogen-free fire retardants, halogenated fire retardants, phosphorus-containing fire retardants, additive and/or reactive flame retardants which may serve as intumescents or char formers, silanes, siloxanes, low melting glasses, zinc-, boron-, aluminum-, or magnesium-based fire retardants, and the like.

Specific compounds contemplated for use as fire retardants include phosphites, phosphates (e.g., butylated triphenyl phosphate, ammonium polyphosphate (APP), and the like), phosphonates, nitrogenes (e.g., melamine derivatives), bromine-containing fire retardants (e.g., brominated styrenes), zinc- and/or boron-based fire retardants (e.g., zinc borate, zinc stannate, borax, and the like), aluminum-based fire retardants (e.g., aluminum trihydrate (ATH)), magnesium-based fire retardants (e.g., magnesium hydroxide), and the like, as well as combinations of any two or more thereof.

Fillers contemplated for use in the practice of the present invention can be either organic or inorganic. Exemplary fillers include ceramic fillers (which provide dimensional stability), fused silica, glass bubbles, glass spheres, polymeric spheres, and the like, as well as combinations of any two or more thereof.

Fillers contemplated for optional use in the practice of the present invention may optionally be conductive (electrically and/or thermally). Electrically conductive fillers contemplated for use in the practice of the present invention include, for example, silver, nickel, gold, cobalt, copper, aluminum, graphite, silver-coated graphite, nickel-coated graphite, alloys of such metals, and the like, as well as mixtures thereof. Both powder and flake forms of filler may be used in the compositions of the present invention. Preferably, the flake has a thickness of less than about 2 microns, with planar dimensions of about 20 to about 25 microns. Flake employed herein preferably has a surface area of about 0.15 to 5.0 $m^2/g$ and a tap density of about 0.4 up to about 5.5 g/cc. It is presently preferred that powder employed in the practice of the invention has a diameter of about 0.5 to 15 microns. If present, the filler typically comprises in the range of about 30% up to about 70% by weight of the adhesive formulation.

Thermally conductive fillers contemplated for optional use in the practice of the present invention include, for example, aluminum nitride, boron nitride, silicon carbide, diamond, graphite, beryllium oxide, magnesia, silica, alumina, and the like. Preferably, the particle size of these fillers will be about 20 microns. If aluminum nitride is used as a filler, it is preferred that it be passivated via an adherent, conformal coating (e.g., silica, or the like).

Fillers that are not electrical conductors may be used in the practice of the present invention. Such fillers may be desirable to impart some other property to the composition according to the invention, such as, for example, reduced thermal expansion of the cured material, increased or reduced dielectric constant, improved toughness, increased hydrophobicity, and the like. Examples of such fillers include perfluorinated hydrocarbon polymers (i.e., TEFLON™), thermoplastic polymers, thermoplastic elastomers, mica, fused silica, glass powder, titanium dioxide, strontium oxide, and the like.

Flow modifiers may optionally be employed in the practice of the present invention to alter the resin flow in order to facilitate achieving desired fill and/or lamination properties. Use of such optional additives may thereby (1) enhance intra-laminar adhesion and/or (2) produce a multi-layered board by bonding resinous prepregs to layers comprising etched circuitry. When employed in accordance with the present invention, such additives are likely to be used at minimum loading levels (e.g., in the range of about 1 up to about 10 weight percent, based on the total weight of the formulation) to gain the benefit such additives can impart (e.g., enhanced heat and pressure induced flow) without compromising other physical and electrical properties.

Flow modifiers contemplated for use herein may be non-reactive or reactive (i.e., capable of participating in oxidative cross-linking). Such materials will desirably exhibit electrical and physical properties which are compatible with all of the components of the above-described compositions.

Exemplary flow modifiers contemplated for use in the practice of the present invention include monomeric, oligomeric, or polymeric (i.e., thermoplastic) saturated (aliphatic) hydrocarbons, unsaturated hydrocarbons, and the like.

Dyes contemplated for use in certain embodiments of the present invention include nigrosine, Orasol blue GN, phthalocyanines, Fluoral green gold dye, and the like. When used, organic dyes in relatively low amounts (i.e., amounts less than about 0.2% by weight) provide contrast.

Pigments contemplated for use in certain embodiments of the present invention include any particulate material added solely for the purpose of imparting color to the formulation, e.g., carbon black, metal oxides (e.g., $Fe_2O_3$, titanium oxide), and the like. When present, pigments are typically present in the range of about 0.5 wt. % up to about 5 wt. %, relative to the base formulation.

Plasticizers (also called flexibilizers) contemplated for use in certain embodiments of the present invention include compounds that reduce the brittleness of the formulation, such as, for example, branched polyalkanes or polysiloxanes that lower the glass transition temperature (Tg) of the formulation. Such plasticizers include, for example, polyethers, polyesters, polythiols, polysulfides, and the like. Plasticizers, when employed, are typically present in the range of about 0.5 wt. % up to about 30 wt. % of the formulation.

Cure retardants (also known as cell size regulators or quenching agents) contemplated for use in certain embodiments of the present invention include compounds which form radicals of low reactivity, such as, for example, silicone surfactants (generally), and the like.

Cure accelerators contemplated for use in certain embodiments of the present invention include compounds which enhance the rate of cure of the base polymer system, such as, for example, catalytically active materials, water, and the like.

Strength enhancers contemplated for use in certain embodiments of the present invention include compounds which increase the performance properties of the polymeric material to which they are added, such as, for example, crosslinking agents, and the like.

UV protectors contemplated for use in certain embodiments of the present invention include compounds which absorb incident ultraviolet (UV) radiation, thereby reducing the negative effects of such exposure on the resin or polymer system to which the protector has been added. Exemplary UV protectors include bis(1,2,2,6,6-pentamethyl-4-piperidinyl) sebacate, silicon, powdered metallic compounds, hindered amines (known in the art as "HALS"), and the like.

Optional diluents contemplated for use in the practice of the present invention include aromatic, aliphatic, cycloaliphatic, and the like, as well as mixtures of any two or more thereof.

Presently preferred diluents contemplated for optional use in the practice of the present invention are relatively non-polar. Exemplary diluents contemplated for use herein include toluene, hexane, cyclohexane, and the like, as well as mixtures of any two or more thereof.

In accordance with another embodiment of the present invention, there are provided methods of making the above-described compositions, said methods comprising combining:

(a) a first component comprising a low loss, low dielectric constant, hydrocarbyl thermoplastic resin, (b) a second component which is capable of crosslinking to produce a thermoset in the presence of the first component, (c) a free radical source, (d) optionally, one or more additives, and (e) an optional diluent therefore under conditions suitable to form an intimate blend thereof.

In accordance with yet another embodiment of the present invention, there are provided articles comprising a layer of the above-described composition on a substrate.

As readily recognized by those of skill in the art, a variety of substrates are suitable for use in the practice of the present invention, for example, polyesters, polyamides, polyolefines, polyphenylene oxides, conductive metals, and the like, as well as combinations of any two or more thereof.

When conductive metal substrates are employed, such materials as silver, nickel, gold, cobalt, copper, aluminum, graphite, silver-coated graphite, nickel-coated graphite, alloys of such metals, and the like, are contemplated for use herein.

In accordance with still another embodiment of the present invention, there are provided methods of making the above-described articles (i.e., articles comprising composition according to the invention on a substrate), said methods comprising applying invention composition to a substrate and removing substantially all diluent therefrom.

In accordance with yet another embodiment of the present invention, there are provided prepregs produced by impregnating a porous substrate with a composition according to the invention, and subjecting the resulting impregnated substrate to conditions suitable to remove substantially all of the diluent therefrom.

As readily recognized by those of skill in the art, a variety of porous substrates can be employed for the preparation of invention prepregs. For example, the substrate can be either woven or non-woven.

Exemplary materials employed for preparation of substrates contemplated for use herein include fiberglass, quartz, polyester fiber, polyamide fiber, polyphenylene sulfide fiber, polyalkylene fiber, liquid crystalline polymer, poly(p-phenylene-2,6-benzobisoxazole), and the like, as well as mixtures of any two or more thereof.

Presently preferred materials employed for preparation of substrates contemplated for use herein include aramid fiber, polytetrafluoroethylene, a copolymer of tetrafluoroethylene and perfluoromethylvinyl ether (MFA), and the like.

In accordance with yet another embodiment of the present invention, there are provided methods of making prepregs comprising a porous substrate impregnated with a composition according to the invention, said methods comprising impregnating a porous substrate with invention composition, and subjecting the resulting impregnated substrate to conditions suitable to remove substantially all of the diluent therefrom. The resulting resin content will typically fall in the range of about 25 up to about 90%

In accordance with still another embodiment of the present invention, there are provided laminated sheets produced by layering and molding a prescribed number of sheets of the above-described prepreg.

Laminated sheets according to the invention have many particularly beneficial properties, such as, for example, low dielectric constant, low electrical loss tangent, a glass transition temperature which is approximately the same as the glass transition temperature of the hydrocarbyl thermoplastic resin employed to prepare the prepreg from which the laminate is prepared, high thermal decomposition temperature, and the like.

In a preferred embodiment, laminated sheets according to the present invention have a dielectric constant ≦4.5 nominal, electrical loss tangent ≦0.02, and a glass transition temperature of at least 80° C.

In accordance with yet another embodiment of the present invention, there are provided methods of making a laminated sheet, said method comprising layering and molding a prescribed number of sheets of a prepreg according to the invention.

In accordance with a further embodiment of the present invention, there are provided printed wiring boards produced by forming conductive patterns on the surface of the above-described laminated sheet(s).

In accordance with a still further embodiment of the present invention, there are provided methods of making printed wiring boards, said methods comprising forming conductive patterns on the surface of a laminated sheet according to the invention.

In accordance with yet another embodiment of the present invention, there are provided multilayer printed wiring boards produced by layering and molding a prescribed number of sheets of the above-described prepreg, to obtain a printed wiring board for an inner layer, and layering the prepreg on the printed wiring board for an inner layer which forms conductive patterns on the surface.

In accordance with still another embodiment of the present invention, there are provided methods of making multilayer printed wiring board, said methods comprising layering and molding a prescribed number of sheets of prepreg according to the invention, to obtain a printed wiring board for an inner layer, and layering the prepreg on the printed wiring board for an inner layer which forms conductive patterns on the surface.

The invention will now be described in greater detail with reference to the following non-limiting examples.

EXAMPLE 1

Several example formulations according to the invention were prepared and the performance properties thereof evaluated. The contents of the varnish designated I-2977 (90 parts cyclic olefin component: 10 parts triallyl isocyanurate) and the varnish designated I-2978 (85 parts cyclic olefin component: 15 parts triallyl isocyanurate) are summarized as set forth in Table 1, as follows:

TABLE 1

| Component | I-2977 Formulation | I-2978 Formulation |
| --- | --- | --- |
| Cyclic olefin component* | 82.7 | 78.1 |
| Triallyl Isocyanurate (TAIC) | 3.2 | 4.8 |
| Dicumyl Peroxide | 0.3 | 0.3 |
| Toluene | 13.7 | 16.7 |
| Total | 100.0 | 100.0 |

*35% solution of Ticona Topas 5013 cyclic-olefin copolymer resin in toluene was used.

Using the above-described formulations, Glass 106 prepregs were produced using metered resin saturation and b-staging conditions of 5 minutes at 130° C. Prepregs were laminated using a lab press (120 minutes, 425° F., 300 psi), and various properties of the resulting prepregs were analyzed, as summarized in Table 2:

TABLE 2

| Property | I-2977 | I-2978 | [UM] |
| --- | --- | --- | --- |
| Cyclic olefin component/TAIC Ratio | 90:10 | 85:15 | |
| % Resin Content | 67 | 67 | % |
| Substrate | 106 | 106 | |
| Dk (1 MHz) | 2.809 | 2.931 | |
| Df (1 MHz) | 0.0018 | 0.0022 | |
| Tg (DSC) | 130/227 | 130/227 | ° C. |
| Decomp. Temp | 439 | 434 | ° C. |
| CTE (x, y, z) | 25/29/59 | 27/30/58 | ppm/° C. |
| Peel Strength | 8.0/7.7 | 7.2/7.3 | lb/in |
| Solder Float | 29 | 130 | seconds |

EXAMPLE 2

A laboratory pilot-treater equipped with an infrared ceramic oven was used to prepare I-2977-containing prepregs based on Glass 106 and Glass 1080. 64% resin content was achieved on standard 106 and 47% resin content was achieved on standard 1080. Prepregs were laminated using a lab press (120 minutes, 425° F., 300 psi) and analyzed, as summarized in Table 3.

TABLE 3

| Property | 18 Plies (32.5 mil) | 2 Plies (3.4 mil) | 14 Plies (29.6 mil) | 5 Plies (11.4 mil) | [U/M] |
| --- | --- | --- | --- | --- | --- |
| % Resin Content | 64 | 64 | 45 | 47 | % |
| Substrate | 106 | 106 | 1080 | 1080 | |
| Dk (1 MHz) | 2.855 | | 3.363 | | |
| Df (1 MHz) | 0.0018 | | 0.0022 | | |
| Electrical Strength | | 880 | | 1030 | V/mil |

TABLE 3-continued

| Property | 18 Plies (32.5 mil) | 2 Plies (3.4 mil) | 14 Plies (29.6 mil) | 5 Plies (11.4 mil) | [U/M] |
|---|---|---|---|---|---|
| Tg (DSC) | 132/227 | | 129/225 | 137/225 | ° C. |
| $T_{260}$ | >60 | | >60 | | min |
| Decomp. Temp. | 430 | | 428 | | ° C. |
| CTE (x, y, z) | 22/18/58 | | 13/15/49 | | ppm/° C. |
| Peel Strength | 7.8/7.7 | 8.0/ | 8.8/6.4 | 9.2/8.2 | lb/in |
| Solder Float | 480 | 3120 | 2 | 0 | sec |
| Water Uptake | 0.02 | | 0.01 | | % |
| Pressure Cooker | 4 | 5 | 1 | 1 | |

Z-axis expansion of an 18 ply I-2977 laminate derived from 106 65% prepreg (laboratory pilot treater material) was compared to laminate derived from an organic ceramic of comparable thickness. Results are summarized in Table 4 follows:

TABLE 4

Thermal Mechanical Analysis (Z-axis)

| | Event | Temperature Range (° C.) | Value [UM] |
|---|---|---|---|
| I-2977 | Expansion Rate Below Tg of 5013 Resin | 50-120 | 89.9 ppm/° C. |
| | Expansion Rate Above Tg of 5013 Resin | 175-225 | 363.4 ppm/° C. |
| | Overall Expansion | 23-250 | 1.9 % |
| | Tg (Thermoplastic, 5013 Resin) | | 132.1 ° C. |
| | Tg (Thermoset, Cross-Linked TAIC) | | 237.2 ° C. |
| Organic Ceramic | Expansion Rate Below Tg | 50-75 | 114.3 ppm/° C. |
| | Expansion Rate Above Tg | 125-200 | 267.8 ppm/° C. |
| | Overall Expansion | 50-250 | 4.0 % |
| | Tg | | 101.2 ° C. |

X-axis and Y-axis expansion of an 18 ply I-2977 laminate derived from 106 65% prepreg (laboratory pilot treater material) was assessed. Results are summarized in Tables 5 and 6 as follows:

TABLE 5

Thermal Mechanical Analysis (X-axis)

| Event | Temperature Range (° C.) | | [UM] |
|---|---|---|---|
| Expansion Rate Below Tg of 5013 Resin | 50-110 | 22.2 | ppm/° C. |
| Expansion Rate Above Tg of 5013 Resin | 150-250 | ~0.0 | ppm/° C. |
| Overall Dimensional Change | 50-250 | −0.1 | % |

TABLE 6

Thermal Mechanical Analysis (Y-axis)

| Event | Temperature Range (° C.) | | [UM] |
|---|---|---|---|
| Expansion Rate Below Tg of COC Resin | 50-110 | 18.3 | ppm/° C. |
| Expansion Rate Above Tg of COC Resin | 150-250 | ~0.0 | ppm/° C. |
| Overall Dimensional Change | 50-250 | −0.1 | % |

In addition to the above-described evaluations, the flow properties of laboratory pilot I-2977 prepreg (106 65%, 4 plies, 340° F., 200 psi, 10 minutes) were evaluated, and can be summarized as set forth in Table 7, as follows:

TABLE 7

| Property | Result | [UM] |
|---|---|---|
| Resin Content | 64 | % |
| Standard Flow | 2.19 | % |
| 2 Hole H1-Initial | 1001 | Mils |
| 2 Hole H1-Min | 38 | Mils |
| 2 Hole H1-Max | 45 | Mils |
| 2 Hole H2-Initial | 1000 | Mils |
| 2 Hole H2-Min | 20 | Mils |
| 2 Hole H2-Max | 44 | Mils |
| % Volatiles | 0.28 | % |

EXAMPLE 3

Another batch of I-2977 (90 parts 5013 resin:10 parts triallyl isocyanurate) varnish, containing 454.0 parts of cyclic olefin component, 17.7 parts of TAIC, 1.8 parts of dicumyl peroxide, and 13.7 parts of toluene, was prepared as follows:

To 295 lbs toluene was added 159 lbs Ticona Topas 5013 resin with high shear (5700 rpm) mixing. Complete dissolution of the 5013 resin (at 35% solids) occurred in approximately 1 hour and 40 minutes. Heat-up due to shear mixing was mild (<40° C.). To the 5013 resin/toluene solution was then added 17.7 lbs of triallyl isocyanurate TAIC). 801 g of dicumyl peroxide was dissolved in 2 lbs toluene. The dicumyl peroxide/toluene solution was then added to the 5013/triallyl isocyanurate/toluene solution in the mix tank. A 10 minute high-shear mix (5700 rpm) homogenized the I-2977 varnish. Varnish viscosity (Z5) was 45 seconds.

106 glass (44 inch width) was then saturated using a production treater. 160 yards of laminate grade 106 (65% resin content) and 110 yards of laminate grade 1080 (55% resin content) was captured using the following process: Z1=225, Z2=253, Z3=279, Z4=320, Z5=320, Z6=320° F., Blower=1780/1650 cfm, Line Speed=10.5 fpm, Metering Gap=11.5, Metering Speed=1.3 fpm, Varnish Viscosity (Zahn 5)=35 seconds. Resulting solvent retention ranged from 2.8 to 3.3%.

Performance characteristics of I-2977 laminates derived from production made prepreg (106 65% and 1080 55%) laminated using a lab press (120 minutes, 425° F., 300 psi) are summarized in Table 8, as follows:

TABLE 8

| Property | 106 65% | 1080 55% | [U/M] |
|---|---|---|---|
| % Resin Content | 67 | 54 | % |
| Electrical Strength | 980 | 1300 | V/mil |
| Tg (DSC) | 120-138/224 | 117-136/224 | ° C. |
| $T_{260}$ | <1 | >60 | min |
| Decomp. Temp. | 444 | 444 | ° C. |
| CTE (x, y, z) | 27/28/100 | 23/19/87 | ppm/° C. |
| Peel Strength | 7.5/7.5 | 7.4/7.2 | lb/in |
| Solder Float | 15 | 5 | sec |
| Water Uptake | 0.02 | 0.02 | % |
| Pressure Cooker | 1 | 1 | |

Performance characteristics of I-2977 laminates derived from production made prepreg (106 65% and 1080 55%) pressed on production lamination equipment (120 minutes, 425° F., 300 psi) are summarized in Table 9, as follows:

TABLE 9

| Property | 106 65% | 106 65%/1080 55% | [U/M] |
|---|---|---|---|
| % Resin Content | 67 | 57 | % |
| Electrical Strength | 1820 | 1500 | V/mil |
| Tg (DSC) | 115-135/224 | 115-137/224 | ° C. |
| $T_{260}$ | >60 | <1 | min |
| Decomp. Temp. | 439 | 444 | ° C. |
| CTE (x, y, z) | 27/29/110 | 26/24/96 | ppm/° C. |
| Peel Strength | 7.0/7.8 | 7.0/6.8 | lb/in |
| Solder Float | 13 | 22 | sec |
| Water Uptake | 0.03 | 0.03 | % |
| Pressure Cooker | 1 | 5 | |

Dielectric constant (Dk) and dissipation loss factor (Df) analysis of laminates derived from I-2977 production made prepregs (106 65%, 1080 55%) was then carries out. Results are summarized in Table 10, as follows:

TABLE 10

| Prepreg | Thickness, mils | Resin % Content | Dk (1 MHz) | Df (1 MHz) |
|---|---|---|---|---|
| 106 65% | 59.8 | 65 | 2.783 | 0.0019 |
| 1080 55% | 45.5 | 55 | 3.011 | 0.0020 |
| 106 65% | 67.9 | 65 | 2.764 | 0.0018 |
| 106 65% and 1080 55% | 60.9 | 57 | 2.954 | 0.0019 |

EXAMPLE 4

I-2942 (80 parts 6017 resin: 20 parts triallyl isocyanurate, 30 phr flame retardant) and I-2947 (70 parts 6017 resin: 30 parts triallyl isocyanurate, 50 phr flame retardant) varnishes were prepared as summarized in Table 11:

TABLE 11

| Component | I-2942 Formulation | I-2947 Formulation |
|---|---|---|
| Cyclic olefin component* | 77.9 | 59.0 |
| Triallyl Isocyanurate (TAIC) | 4.9 | 6.3 |
| Dicumyl Peroxide | 0.8 | 0.8 |
| Exolit OP-930 | 7.3 | 10.6 |
| Toluene | 9.1 | 23.2 |
| Total | 100.0 | 100.0 |

*25% solution of Ticona Topas 6017 cyclic-olefin copolymer resin in cyclohexane/toluene (80:20) was used.

Glass 7628 and 1080 prepregs were produced using metered resin saturation and b-staging conditions involving temperature gradient drying. Prepregs were laminated using a lab press (120 minutes, 425° F., 300 psi). Selected properties of the resulting laminates are summarized in Table 12:

TABLE 12

| Property | I-2942 Formulation | I-2947 Formulation | [U/M] |
|---|---|---|---|
| % Resin Content | 25.0 | 55.4 | % |
| Substrate | 7628 | 1080 | |
| Dk (1 MHz) | 3.86 | 3.11 | |
| Df (1 MHz) | 0.0024 | 0.0026 | |
| Tg (DSC) | 164 | 164 | ° C. |
| Decomp. Temp | 417 | 423 | ° C. |
| Solder Float | delamination | 29 | seconds |
| $T_{260}$ | delamination | >60 | minutes |
| Flammability | V-1 | V-1 | UL-94 |

EXAMPLE 5

I-2963 (70 parts 6017 resin: 30 parts triallyl isocyanurate, 50 phr flame retardant (equal blend of OP-930 and melamine cyanurate) varnish was prepared as summarized in Table 13:

TABLE 13

| Component | I-2963 Formulation |
|---|---|
| Cyclic olefin component* | 59.0 |
| Triallyl Isocyanurate (TAIC) | 6.3 |
| Dicumyl Peroxide | 0.8 |
| Exolit OP-930** | 5.2 |
| Fyrol Melamine Cyanurate | 5.2 |
| Toluene | 23.3 |
| Total | 100.0 |

*25% solution of Ticona Topas 6017 cyclic-olefin copolymer resin in cyclohexane/toluene (80:20) was used;
**Exolit OP-930 is a commercially available flame retardant.

Glass 1080 prepregs were produced using metered resin saturation and b-staging conditions of 5 minutes at 130° C. Prepregs were laminated using a lab press (120 minutes, 425° F., 300 psi).

Flammability results are summarized in Table 14 below. UL-94 V1 flammability results were achieved using an equal blend of Exolit OP-930 and Fyrol melamine cyanurate at 50 phr loading.

TABLE 14

| Sample | Flame After 1st Ignition | Flame After 2nd Ignition | After Glow | Burn-To-Clamp | Thickness |
|---|---|---|---|---|---|
| I-2963 (All FR Layers) | | | | | |
| 1 | 0 | 2.0 | 0 | No | 0.0620 |
| 2 | 0 | 15.1* | 0 | No | 0.0626 |
| 3 | 0 | 1.2 | 0 | No | 0.0590 |
| 4 | 0 | 32.6* | 0 | No | 0.0624 |
| 5 | 0 | 1.0 | 0 | No | 0.0593 |
| I-2963 (Non-FR Outer-Layers) | | | | | |
| 1 | 1.0 | 8.9* | 0 | No | 0.0545 |
| 2 | 0.9 | 2.2 | 0 | No | 0.0576 |
| 3 | 0.9 | 1.3 | 0 | No | 0.0563 |
| 4 | 1.0 | 1.8 | 0 | No | 0.0573 |
| 5 | 0.6 | 35.1* | 0 | No | 0.0553 |

*Sample Delaminated During Test

Copper peel strength (AR/AS) was enhanced through the use of non-FR outer-layers in lamination, as illustrated by the data summarized in Table 15:

TABLE 15

| Property | I-2963 | I-2963* | [U/M] |
|---|---|---|---|
| Construction | All FR Layers | *Non-FR Outer-Layers | |
| Thickness | 62.8 | 56.6 | Mils |
| % Resin Content | 61.6 | 60.4 | % |
| Substrate | 1080 | 1080 | |
| Dk (1 MHz) | 3.28 | 3.26 | |
| Df (1 MHz) | 0.0026 | 0.0024 | |
| Tg (2nd Pass, DSC) | 162 | 167 | ° C. |
| Solder Float | >75 | >71 | Minutes |
| Peel Strength | 2.4/2.0 | 7.1/6.5 | lb/in |
| Flammability | V1 | V1 | UL-94 |

EXAMPLE 6

I-2995 (90 parts 5013 resin: 10 parts triallyl isocyanurate, 75 phr fused silica) varnish was prepared as summarized in Table 16, as follows:

TABLE 16

| Component | I-2995 Formulation |
|---|---|
| Cyclic olefin component* | 47.3 |
| Triallyl Isocyanurate (TAIC) | 1.8 |
| Dicumyl Peroxide | 0.3 |
| HUF-130 Fused Silica | 13.8 |
| Toluene | 36.8 |
| Total | 100.0 |

*35% solution of Ticona Topas 5013 cyclic-olefin copolymer resin in toluene was used.

Glass 1080 prepregs were produced using metered resin saturation and varied b-staging conditions: 4.5, 5.0 and 6.0 minutes at 130° C. Prepregs were laminated using a lab press (120 minutes, 425° F., 300 psi). Performance properties of the resulting laminates derived from I-2995 prepreg were analyzed. Results are summarized in Table 17 as follows:

TABLE 17

| Property* | 4.5 min | 5.0 min | 6.0 min | [UM] |
|---|---|---|---|---|
| % Resin Content | 55.8 | 59.0 | 54.4 | % |
| Enthalpy - Resin Only | 104.4 | 100.3 | 100.2 | J/g |
| Flow, 2 Hole Test | 16 | 11 | 12 | Mils |
| % Volatiles | 2.3 | 2.1 | 1.9 | % |
| Thickness | 31.5 | 59.8 | 30.7 | Mils |
| Tg (DSC) | 132/222 | 129/226 | 133/222 | ° C. |
| $T_{260}$ | >60 | >60 | >60 | Minutes |
| Dk (1 GHz) | 3.32 | 3.34* | 3.39 | |
| Peel Strength AR/AS | 4.2/3.8 | 4.6/4.4 | 3.7/4.2 | Lb/in |
| Solder Float | <10 | 11 | 135 | seconds |

*Dk = 3.44, Df = 0.0022 at 1 MHz

EXAMPLE 7

I-2998 (90 parts 5013 resin: 10 parts triallyl isocyanurate, 50 phr fused silica, 0.75 phr $TiO_2$) varnish was prepared as summarized in Table 18, which follows:

TABLE 18

| Component | I-2998 Formulation |
|---|---|
| Cyclic olefin component* | 54.9 |
| Triallyl Isocyanurate (TAIC) | 2.1 |
| Dicumyl Peroxide | 0.3 |
| HUF-130 Fused Silica | 10.7 |
| DuPont R900 $TiO_2$ | 0.2 |
| Toluene | 31.8 |
| Total | 100.0 |

*35% solution of Ticona Topas 5013 cyclic-olefin copolymer resin in toluene was used.

Glass 1080 prepregs were produced using metered resin saturation and varied b-staging conditions: 4.5, 5.0 and 6.0 minutes at 130° C. Prepregs were laminated using a lab press (120 minutes, 425° F., 300 psi). Performance properties of the resulting laminates derived from I-2998 prepreg were analyzed. Results are summarized in Table 19 as follows:

TABLE 19

| Property | 4.5 min | 5.0 min | 6.0 min | [UM] |
|---|---|---|---|---|
| % Resin Content | 56.9 | 59.3 | 58.8 | % |
| Enthalpy - Resin Only | 93.9 | 92.2 | 107.3 | J/g |
| Flow, 2 Hole Test | 25 | 28 | 21 | Mils |
| % Volatiles | 2.5 | 2.7 | 2.4 | % |
| Thickness | 34.3 | 31.7 | 31.0 | Mils |
| Tg (DSC) | 131/221 | 132/221 | 133/221 | ° C. |
| $T_{260}$ | >60 | >60 | >60 | Minutes |
| Dk (1 GHz) | 3.23 | 3.26 | 3.28 | |
| Peel Strength AR/AS | 5.3/4.6 | 5.0/4.2 | 5.4/4.8 | Lb/in |
| Solder Float | <10 | <10 | <10 | seconds |

While the invention has been described in detail with reference to certain preferred embodiments thereof, it will be understood that modifications and variations are within the spirit and scope of that which is described and claimed.

That which is claimed is:

1. A composition comprising an intimate blend of:
   (a) a non-reactive polymeric first component comprising a low loss, low dielectric constant, hydrocarbyl thermoplastic resin having no residual unsaturation and no crosslinkable substitution thereon,
   (b) a reactive monomeric second component which is free-radically crosslinkable to produce a thermoset in the presence of the first component,
   (c) a free radical source,
   (d) optionally, one or more additives, and
   (e) an optional diluent therefor.

2. The composition of claim 1 wherein said composition, after cure, has a dielectric constant ≦4.5 nominal, and an electrical loss tangent ≦0.02.

3. The composition of claim 1 wherein said composition, after cure, has a glass transition temperature ≧80° C.

4. The composition of claim 1 wherein (a) is a cyclic olefin-containing copolymer, terpolymer, block copolymer, or combination of any two or more thereof.

5. The composition of claim 4 wherein said cyclic olefin-containing copolymer is a copolymer of an aliphatic olefin and a cyclic olefin.

6. The composition of claim 4 wherein said cyclic olefin-containing copolymer is a copolymer of an olefin and norbornene.

7. The composition of claim 6 wherein said copolymer is synthesized by addition polymerization.

8. The composition of claim 6 wherein the molar ratio of olefin to norbornene falls in the range of about 1:6 up to about 1:1.5.

9. The composition of claim 4 wherein said cyclic olefin-containing copolymer has a molecular weight in the range of about 500 up to about 100,000.

10. The composition of claim 1 wherein said compound is non-polar.

11. The composition of claim 1 wherein (b) has the structure (II) as follows:

$$Y \!-\!\!\left[Q_{0,1}\!-\!CR\!=\!CHR\right]_q \quad (II)$$

wherein:
   q is an integer between 1 and 6, provided, however, that not all q's are 1,
   each R is independently selected from hydrogen or lower alkyl, each Q, when present, is independently selected from —CH$_2$—, —O—, —O—C(O)—, —C(O)— or —C(O)—O—, and each Y is independently a monovalent or polyvalent moiety, provided, however, that not all Y's are monovalent.

12. The composition of claim 11 wherein Y is selected from the group consisting of hydrocarbyl, substituted hydrocarbyl, heteroatom-containing hydrocarbyl, substituted heteroatom-containing hydrocarbylene, hydrocarbylene, substituted hydrocarbylene, heteroatom-containing hydrocarbylene, substituted heteroatom-containing hydrocarbylene, and technically feasible combinations of any of the above with a linker selected from the group consisting of a covalent bond, —O—, —S—, —NR—, —O—C(O)—, —O—C(O)—O—, —O—C(O)—NR—, —NR—C(O)—, —NR—C(O)—O—, —NR—C(O)—NR—, —S—C(O)—, —S—C(O)—O—, —S—C(O)—NR—, —O—S(O)$_2$—, —O—S(O)$_2$—O—, —O—S(O)$_2$—NR—, —O—S(O)—, —O—S(O)—O—, —O—S(O)—NR—, —O—NR—C(O)—, —O—NR—C(O)—O—, —O—NR—C(O)—NR—, —NR—O—C(O)—, —NR—O—C(O)—O—, —NR—O—C(O)—NR—, —O—NR—C(S)—, —O—NR—C(S)—O—, —O—NR—C(S)—NR—, —NR—O—C(S)—, —NR—O—C(S)—O—, —NR—O—C(S)—NR—, —O—C(S)—, —O—C(S)—O—, —O—C(S)—NR—, —NR—C(S)—, —NR—C(S)—O—, —NR—C(S)—NR—, —S—S(O)$_2$—, —S—S(O)$_2$—O—, —S—S(O)$_2$—NR—, —NR—O—S(O)—, —NR—O—S(O)—O—, —NR—O—S(O)—NR—, —NR—O—S(O)$_2$—, —NR—O—S(O)$_2$—O—, —NR—O—S(O)$_2$—NR—, —O—NR—S(O)—, —O—NR—S(O)—O—, —O—NR—S(O)—NR—, —O—NR—S(O)$_2$—O—, —O—NR—S(O)$_2$—NR—, —O—NR—S(O)$_2$—, —O—P(O)R$_2$—, —S—P(O)R$_2$—, —NR—P(O)R$_2$—;

wherein each R is independently hydrogen, alkyl or substituted alkyl.

13. The composition of claim 1 wherein (b) is a thermally stable dielectric material selected from the group consisting of di-allylic compound(s), tri-allylic compound(s), di-vinyllic compound(s), tri-vinyllic compound(s), conjugated diene(s), non-conjugated diene(s), di(meth)acrylate compound(s), tri(meth)acrylate compound(s), and mixtures of any two or more thereof.

14. The composition of claim 1 wherein (b) is triallyl isocyanurate or triallyl cyanurate.

15. The composition of claim 1 wherein said free radical source is thermally or photochemically activated.

16. The composition of claim 1 wherein (c) is activated thermally.

17. The composition of claim 16 wherein (c) is a peroxide having a decomposition temperature of at least about 35° C.

18. The composition of claim 17 wherein (c) is dicumyl peroxide.

19. The composition of claim 1 wherein (c) is an azo compound, a redox initiator, or a bisazide.

20. The composition of claim 1 wherein (c) is activated by ultraviolet or electron-beam irradiation.

21. The composition of claim 20 wherein (c) is selected from the group consisting of benzophenone, 9-phenyl acridine, ethyl Michler's ketone (EMK), zinc acetylacetonate, and triphenyl phosphine oxide.

22. The composition of claim 1 wherein (c) is present in an amount falling in the range of about 0.01-10 weight percent, based on the total weight of the composition.

23. The composition of claim 1, wherein said optional additive is selected from the group consisting of fire retardants, fillers, fluorescent dyes, and flow modifiers.

24. The composition of claim 1 wherein (d) is a substantially halogen-free fire retardant.

25. The composition of claim 1 wherein (d) is a phosphorus-containing fire retardant.

26. The composition of claim 1 wherein (e), when present, is an aromatic, aliphatic, cycloaliphatic, and mixtures of any two or more thereof.

27. The composition of claim 26 wherein (e) is non-polar.

28. The composition of claim 26 wherein (e) is toluene, hexane, cyclohexane, and mixtures of any two or more thereof.

29. The composition of claim 1 wherein the weight ratio between (a) and (b) falls in the range of about 1:1 up to about 100:1.

30. The composition of claim 1 wherein the weight ratio between (a) and (b) falls in the range of about 1.5:1 up to about 99:1.

31. An article comprising a layer of the composition of claim 1 on a substrate.

32. The article of claim 31 wherein said substrate is a polyester, a polyamide, a polyolefine, a polyphenylene oxide, or a conductive metal.

33. The article of claim 32 wherein said conductive metal is selected from the group consisting of silver, nickel, gold, cobalt, copper, aluminum, graphite, silver-coated graphite, nickel-coated graphite, and alloys of such metals.

34. A prepreg produced by impregnating a porous substrate with a composition according to claim 1, and subjecting the resulting impregnated substrate to conditions suitable to remove substantially all of the diluent therefrom.

35. The prepreg of claim 34 wherein said substrate is woven or non-woven.

36. The prepreg of claim 35 wherein said substrate is selected from the group consisting of fiberglass, quartz, polyester fiber, polyamide fiber, polyphenylene sulfide fiber, polyalkylene fiber, liquid crystalline polymer, poly(p-phenylene-2,6-benzobisoxazole), and mixtures of any two or more thereof.

37. The prepreg of claim 36 wherein said substrate is selected from the group consisting of aramid fiber, polytetrafluoroethylene, a copolymer of tetrafluoroethylene and perfluoromethylvinyl ether (MFA).

38. A method of making an article comprising a composition according to claim 1 on a substrate, said method comprising applying said composition to a substrate and removing substantially all diluent therefrom.

39. A method of making a prepreg comprising a porous substrate impregnated with a composition according to claim 1, said method comprising impregnating a porous substrate with said composition, and subjecting the resulting impregnated substrate to conditions suitable to remove substantially all of the diluent therefrom.

40. The composition of claim 1 wherein the weight ratio between (a) and (b) is about 90:10.

41. The composition of claim 1 wherein the weight ratio between (a) and (b) is about 80:20.

42. The composition of claim 1 wherein the weight ratio between (a) and (b) is about 70:30.

43. The composition of claim 1 wherein (d) is a halogenated fire retardant.

44. A composition comprising an intimate blend of:
(a) a non-reactive first component comprising a low loss, low dielectric constant, hydrocarbyl cyclic olefin-containing copolymeric thermoplastic resin having no residual unsaturation and no crosslinkable substitution thereon,
(b) a reactive second component which is free-radically crosslinkable to produce a thermoset in the presence of the first component,
(c) a free radical source,
(d) optionally, one or more additives, and
(e) an optional diluent therefor.

45. The composition of claim 44 wherein said cyclic olefin-containing co-polymeric thermoplastic resin is synthesized by addition polymerization of norbornene with an olefin.

46. The composition of claim 45 wherein said cyclic olefin-containing copolymer has a molecular weight in the range of about 20,000 up to about 90,000.

47. A composition comprising an intimate blend of:
(a) a non-reactive first component comprising a low loss, low dielectric constant, hydrocarbyl thermoplastic resin having no residual unsaturation and no crosslinkable substitution thereon,
(b) a reactive second component which is free-radically crosslinkable to produce a thermoset in the presence of the first component, wherein said second component is non-polar and has the following structure:

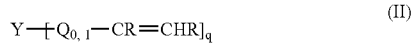

(II)

wherein:
q is 2 or 3,
each R is independently selected from hydrogen or lower alkyl,
each Q, when present, is independently selected from —$CH_2$—, —O—, —O—C(O)—, —C(O)— or —C(O)—O—, and
Y is a polyvalent moiety selected from the group consisting of heteroatom-containing hydrocarbylene and substituted heteroatom-containing hydrocarbylene,
(c) a free radical source,
(d) optionally, one or more additives, and
(e) an optional diluent therefor.

48. The composition of claim 47 wherein said second component is triallyl isocyanurate.

49. The composition of claim 48 wherein said composition comprises no greater than 90 parts of said first component and at least 10 parts of said second component.

50. A composition consisting essentially of an intimate blend of:
(a) a non-reactive first component comprising a low loss, low dielectric constant, hydrocarbyl thermoplastic resin,
(b) a reactive second component which is free-radically crosslinkable to produce a thermoset in the presence of the first component,
(c) a free radical source,
(d) optionally, one or more additives selected from the group consisting of fire retardants, fillers, fluorescent dyes, flow modifiers, plasticizers, cure retardants, cure accelerators, strength enhancers, UV protectors, and pigments, as well as mixtures of any two or more thereof, and
(e) an optional diluent therefor.

* * * * *